United States Patent
Fan et al.

(10) Patent No.: US 10,419,589 B2
(45) Date of Patent: Sep. 17, 2019

(54) MOBILE PHONE WITH SLIDABLE HOUSING ASSEMBLY FOR HIDING AND EXPOSING A CAMERA

(71) Applicant: GUANGDONG OPPO MOBILE TELECOMMUNICATIONS CORP., LTD., Dongguan, Guangdong (CN)

(72) Inventors: Xiaoyu Fan, Dongguan (CN); Zhengshan Zhang, Dongguan (CN)

(73) Assignee: GUANGDONG OPPO MOBILE TELECOMMUNICATIONS CORP., LTD, Dongguan (CN)

( * ) Notice: Subject to any disclaimer, the term of this patent is extended or adjusted under 35 U.S.C. 154(b) by 0 days.

(21) Appl. No.: 16/220,560

(22) Filed: Dec. 14, 2018

(65) Prior Publication Data

US 2019/0253543 A1 Aug. 15, 2019

(30) Foreign Application Priority Data

Feb. 9, 2018 (CN) ...................... 2018 2 0244128 U (51) Int. Cl.
*H04M 1/02* (2006.01)
*H05K 5/00* (2006.01)
*G06F 1/16* (2006.01)

(52) U.S. Cl.
CPC ........ *H04M 1/0264* (2013.01); *G06F 1/1686* (2013.01); *H04M 1/0266* (2013.01); *H05K 5/0017* (2013.01); *H05K 5/0086* (2013.01)

(58) Field of Classification Search
CPC ............ H04M 1/0264; H04M 1/0241; H04M 1/0237; H04M 1/0235; H04M 1/0208; G06F 1/1686; G06F 1/1624
See application file for complete search history.

(56) References Cited

U.S. PATENT DOCUMENTS

| 10,178,311 B2* | 1/2019 | Jang .................. H04N 5/23222 |
| 2001/0009847 A1* | 7/2001 | Kim ....................... H01Q 1/244 455/575.4 |

(Continued)

FOREIGN PATENT DOCUMENTS

| CN | 106657456 A | 5/2017 |
| CN | 106899721 A | 6/2017 |

(Continued)

OTHER PUBLICATIONS

International Search Report in the international application No. PCT/CN2018/121569, dated Mar. 15, 2019.

(Continued)

*Primary Examiner* — Devan A Sandiford
(74) *Attorney, Agent, or Firm* — Ladas & Parry, LLP (57) ABSTRACT

Described is a mobile phone, which includes a rear housing, a display screen and a camera. The rear housing includes a first shell and a second shell. The first shell includes a primary backboard and side perimeter edges. The second shell includes a secondary backboard and outer perimeter edges. The secondary backboard is slidably connected with the primary backboard, and the secondary backboard is provided with a first position and a second position. At the first and second positions, the side perimeter edges are connected with and separated from the outer perimeter edges, respectively. The display screen is located at one side of the primary backboard. The camera is arranged on the secondary backboard. At the first position, the camera is blocked. At the second position, the camera is exposed and an orientation of a light incident surface of the camera is identical to that of the display screen.

19 Claims, 11 Drawing Sheets

(56) References Cited

U.S. PATENT DOCUMENTS

| | | | | |
|---|---|---|---|---|
| 2005/0014527 | A1* | 1/2005 | Chambers | H04M 1/0264 455/556.1 |
| 2005/0049019 | A1* | 3/2005 | Lee | H04M 1/0237 455/575.4 |
| 2005/0157195 | A1* | 7/2005 | Ohashi | H04M 1/0214 348/333.06 |
| 2005/0245295 | A1* | 11/2005 | Lee | H04M 1/0235 455/575.1 |
| 2006/0088310 | A1* | 4/2006 | Jung | G03B 17/04 396/429 |
| 2006/0121959 | A1* | 6/2006 | Cha | H04M 1/0247 455/575.1 |
| 2006/0152576 | A1* | 7/2006 | Kiessling | H04M 1/0256 348/14.01 |
| 2007/0009247 | A1* | 1/2007 | Maeda | G02B 7/102 396/72 |
| 2007/0242948 | A1* | 10/2007 | Miramontes | G03B 17/00 396/448 |
| 2008/0176605 | A1* | 7/2008 | Choi | H04M 1/0208 455/566 |
| 2009/0093274 | A1* | 4/2009 | Yamamoto | G02B 13/0015 455/566 |
| 2009/0203398 | A1* | 8/2009 | Griffin | H04M 1/0235 455/556.1 |
| 2012/0162263 | A1* | 6/2012 | Griffin | G06F 1/1624 345/652 |
| 2014/0080542 | A1* | 3/2014 | Pan | H04M 1/0264 455/556.1 |
| 2015/0264162 | A1* | 9/2015 | Peng | H04M 1/0264 455/556.1 |
| 2016/0013805 | A1* | 1/2016 | Maehata | H03M 3/422 341/143 |
| 2017/0223158 | A1* | 8/2017 | Yin | H04M 1/02 |
| 2018/0007182 | A1 | 1/2018 | Lin | |
| 2018/0205809 | A1 | 7/2018 | Luo et al. | |
| 2019/0014201 | A1 | 1/2019 | Bao | |
| 2019/0033926 | A1* | 1/2019 | Huang | G06F 1/1686 |

FOREIGN PATENT DOCUMENTS

| | | | |
|---|---|---|---|
| CN | 107295129 A | 10/2017 | |
| CN | 107343064 A | 11/2017 | |
| CN | 207910858 U | 9/2018 | |
| DE | 202017003703 U1 * | 7/2017 | H04M 1/185 |
| EP | 3255867 A1 | 12/2017 | |
| WO | 2017008525 A1 | 1/2017 | |

OTHER PUBLICATIONS

Written Opinion of the International Search Authority in the international application No. PCT/CN2018/121569, dated Mar. 18, 2019.

Supplementary European Search Report in the European application No. 18210928.0, dated Apr. 10, 2019.

* cited by examiner

MOBILE PHONE WITH SLIDABLE HOUSING ASSEMBLY FOR HIDING AND EXPOSING A CAMERA

CROSS-REFERENCE TO RELATED APPLICATIONS

The present application claims benefit of and priority to Chinese Application No. 201820244128.6, filed on Feb. 9, 2018, the contents of which are hereby incorporated by reference in their entireties.

TECHNICAL FIELD

The present disclosure relates to the technical field of mobile terminals, and in particular to a mobile phone.

BACKGROUND

At present, a mobile terminal such as a smart phone is equipped with a camera for providing functions such as a video call and a selfie. The camera needs to occupy a partial space of a display panel of the mobile terminal, which results in that a displaying area on the display panel of the mobile terminal is reduced relatively, and thus it is not beneficial to realize a high screen-to-body ratio.

BRIEF DESCRIPTION OF DRAWINGS

In order to describe the technical solutions in the embodiments of the present disclosure or in the related art more clearly, a simple introduction on the accompanying drawings which are needed in the description of the embodiments or in the related art is given below. Apparently, the accompanying drawings in the description below are only a part of the embodiments of the present disclosure, based on which other drawings may be obtained by those skilled in the art without any creative effort.

DETAILED DESCRIPTION

In order to understand the present disclosure, the present disclosure will be clearly and completely described with reference to the accompanying drawings. Preferred embodiments of the present disclosure are given in the accompanying drawings. However, the present disclosure may be implemented in many different forms and is not limited to the embodiments described herein. On the contrary, providing these embodiments is to understand the disclosed content of the present disclosure more thoroughly and comprehensively.

It is to be noted that, when an element is "fixed on" another element, it may be directly on the other element, or intervening element(s) may be present. When an element is "connected to/with" another element, it may be directly connected to/with the other element, or intervening element(s) may be present simultaneously. Terms "vertical", "horizontal", "left", "right" and similar expressions used herein are merely for description.

Unless otherwise defined, all technical and scientific terms used herein have the same meaning as commonly understood by those skilled in the art. The terms used in the specification are merely for describing the purpose of the specific embodiment and do not intended to limit the present disclosure. The term "and/or" used herein may include any and all combinations of one or more relevant items.

As used herein, the "communication terminal" (or abbreviated as a "Terminal") includes, but not limited to, a device configured to connect via a wired circuit (for example, via a Public Switched Telephone Network (PSTN), a Digital Subscriber Line (DSL), a digital cable, a direct cable connection and/or another data connection/network) and/or receive/send a communication signal via a wireless interface (for example, a cellular network, a Wireless Local Area Network (WLAN), a digital television network such as a Digital Video Broadcasting-Handheld (DVB-H) network, a satellite network, an AM-FM broad transmission equipment and/or another communication terminal). The communication terminal configured to communicate via a wireless interface may be referred to as a "wireless communication terminal", a "wireless terminal" and/or a "mobile terminal". Examples of the mobile terminal include, but not limited to, a satellite or cellular telephone, a Personal Communication System (PCS) terminal capable of combining with a cellular wireless telephone and data processing, faxing and data communication abilities, a Personal Digital Assistant (PDA) that may include a radio telephone, a pager, an internet/intranet access, a Web browser, a memo pad, a calendar and/or a Global Position System (GPS) receiver, and a conventional laptop and/or palmtop receiver or other electronic devices including a radio telephone receiver.

The present disclosure relates to a mobile phone which includes a rear housing, a display screen and a camera.

The rear housing includes a first shell and a second shell; wherein the first shell includes a primary backboard and side perimeter edges; the primary backboard includes a first side surface, a second side surface opposite to the first side surface, and four side edges; the side perimeter edges are arranged on three side edges of the primary backboard and include a first side perimeter edge, a second side perimeter edge opposite to the first side perimeter edge, and a third side perimeter edge connected between the first side perimeter edge and the second side perimeter edge; wherein the second shell includes a secondary backboard and outer perimeter edges; the secondary backboard includes a first side surface, a second side surface opposite to the first side surface, and four side edges; the outer perimeter edges are arranged on three side edges of the secondary backboard and includes a first outer perimeter edge, a second outer perimeter edge opposite to the first outer perimeter edge, and a third outer perimeter edge connected between the first outer perimeter edge and the second outer perimeter edge; the side edge of the secondary backboard without the outer peripheral edge is slidably connected with the side edge of the primary backboard without the side peripheral edge; the secondary backboard is provided with a first position and a second position relative to the primary backboard; at the first position, the first side perimeter edge is connected with the first outer perimeter edge, and the second side perimeter edge is connected with the second outer perimeter edge; at the second position, the first side perimeter edge is separated from the first outer perimeter edge, and the second side perimeter edge is separated from the second outer perimeter edge.

The display screen is located at the side where the first side surface of the primary backboard is located, and is fixedly connected with the first side perimeter edge, the second side perimeter edge and the third side perimeter edge.

The camera is arranged on the first side surface of the secondary backboard; at the first position, the camera is blocked; and at the second position, the camera is exposed and an orientation of a light incident surface of the camera is identical to an orientation of the display screen.

In one embodiment, a height of each of the outer perimeter edges may be greater than that of the secondary backboard.

In one embodiment, buffer edges may be provided at borders of the display screen fixedly connected with the first side perimeter edge, the second side perimeter edge and the third side perimeter edge; and a hardness of each of the buffer edges may be less than that of a cover plate of the display screen.

In one embodiment, the mobile phone may further include another camera; the another camera may be arranged on the second side surface of the secondary backboard; and an orientation of a light incident surface of the another camera may be opposite to an orientation of the display screen.

In one embodiment, the another camera and the camera mutually may be staggered on the secondary backboard.

In one embodiment, the second side surface of the primary backboard may be level with the second side surface of the secondary backboard.

In one embodiment, the second side surface of the primary backboard may be provided with a notch at the side edge of the primary backboard without the side peripheral edge; the second side surface of the secondary backboard may be provided with a bump at the side edge of the secondary backboard without the outer peripheral edge; and the bump may be cooperated with the notch.

In one embodiment, a gap formed by connecting the first side perimeter edge with the first outer perimeter edge may be of a linear shape, an arc shape or a broken line shape.

In one embodiment, a gap formed by connecting the second side perimeter edge with the second outer perimeter edge may be of a linear shape, an arc shape or a broken line shape.

In one embodiment, the mobile phone may further include a motor; the motor may be fixed on the primary backboard; an output shaft of the motor may be provided with a gear; the secondary backboard may be provided with a rack; and the rack may be cooperated with the gear so that the secondary backboard is switched between the first position and the second position relative to the primary backboard by virtue of the motor.

In one embodiment, the mobile phone may include a motor, a gearbox, a screw rod and a sliding rod; an output shaft of the gearbox may be parallel to a movement direction of the secondary backboard; the gearbox may include at least two engaged gears; the gearbox may be connected between the motor and the screw rod so that the motor drives the screw rod to rotate; the screw rod may be provided with a spiral groove; the sliding rod may be connected with the secondary backboard and may be provided with a clamping ring which is cooperated with the spiral groove; and a rotation of the screw rod may drive the sliding rod to move so that the secondary backboard is switched between the first position and the second position relative to the primary backboard.

In one embodiment, the clamping ring may be rotatably arranged on the sliding rod.

In one embodiment, the side edge of the secondary backboard without the outer peripheral edge may extend toward the primary backboard to form a sliding tongue; and the sliding tongue may be slidably arranged on the primary backboard.

In one embodiment, the mobile phone may further include a face recognition component arranged on the secondary backboard; at the first position, the face recognition component may be blocked; and at the second position, the face recognition component may be exposed.

In one embodiment, the first shell may be made of a metal material, a glass material, or a ceramic material.

In one embodiment, the second shell may be made of a metal material, a glass material, or a ceramic material.

In one embodiment, the display screen may be an organic light emitting diode (OLED) display screen or a liquid crystal display (LCD) screen.

In one embodiment, when the first shell is at the first position relative to the second shell, a ratio of a displaying area of the display screen to an area of an outline of the rear housing may be greater than or equal to 83%.

In one embodiment, the mobile terminal may further include another camera, the another camera may be arranged on the bump of the second side surface, and an orientation of a light incident surface of the another camera may be opposite to that of the display screen.

The present disclosure also relates to a mobile phone, which includes a rear housing, a display screen and a camera. The rear housing includes a first shell and a second shell arranged slidably, the second shell is provided with a first position and a second position relative to the first shell; the rear housing is provided with a first side surface and a second side surface opposite to the first side surface; when the second shell is located at the first position relative to the first shell, a continuous surface is formed at a side where the second side surface of the rear housing is located. The display screen is arranged at a side where the first side surface of the rear housing is located. The camera is arranged on the second shell and is moved along with the second shell relative to the first shell; when the camera is moved to the first position along with the second shell, the camera is hidden in the mobile terminal; when the camera is moved to the second position along with the second shell, the camera is exposed outside the mobile terminal, and an orientation of a light incident surface of the camera is identical to an orientation of the display screen.

Figure 1:
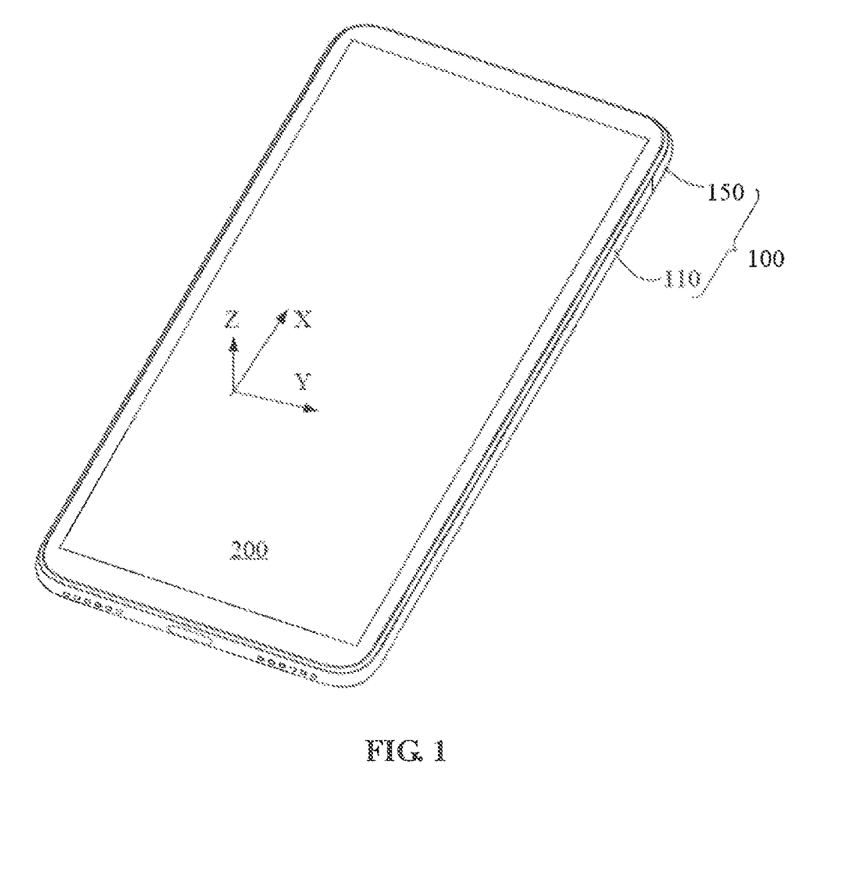
FIG. 1 illustrates a perspective diagram of a mobile terminal at an angle according to an embodiment; herein, a second shell in the mobile terminal is at a first position relative to a first shell.
Figure 2:
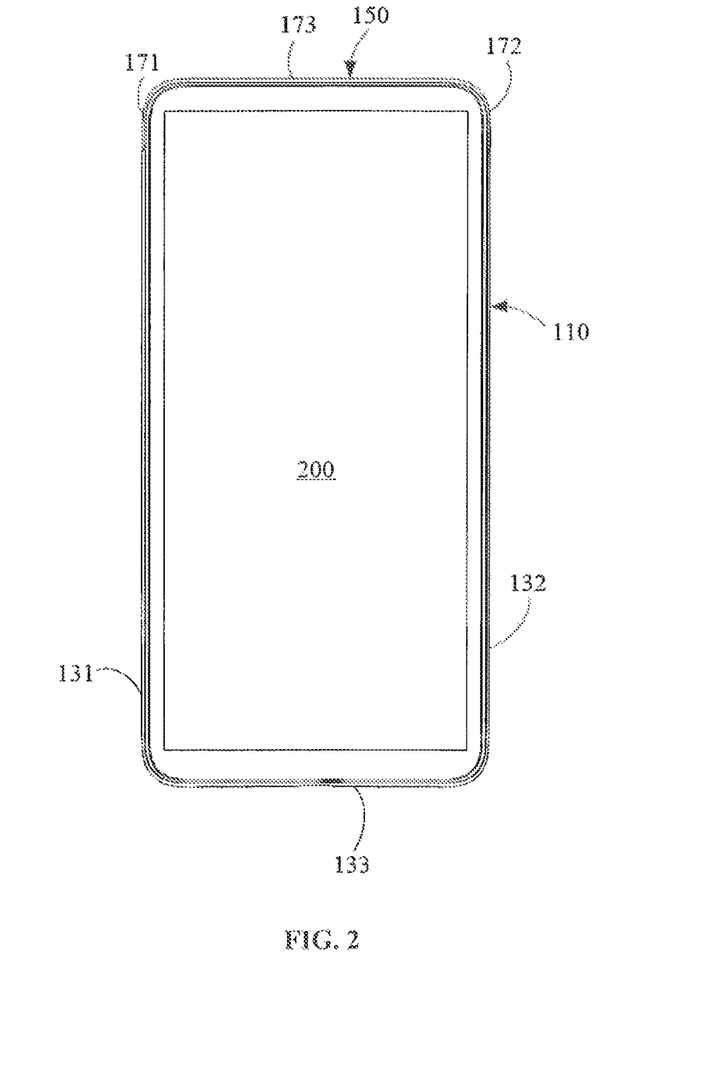
FIG. 2 illustrates a front diagram of the mobile terminal illustrated in FIG. 1.
Figure 3:
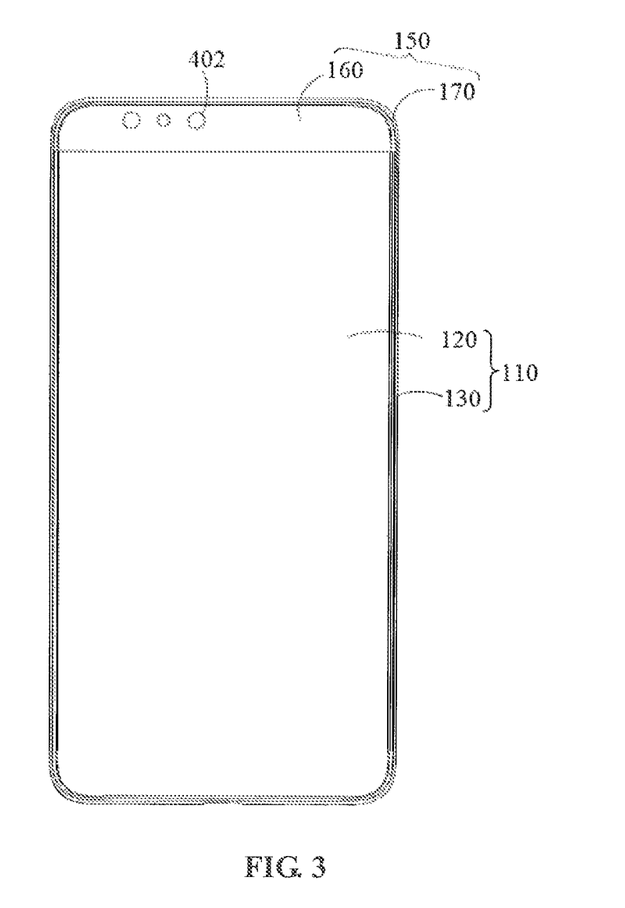
FIG. 3 illustrates a rear diagram of the mobile terminal illustrated in FIG. 1.
Figure 4:
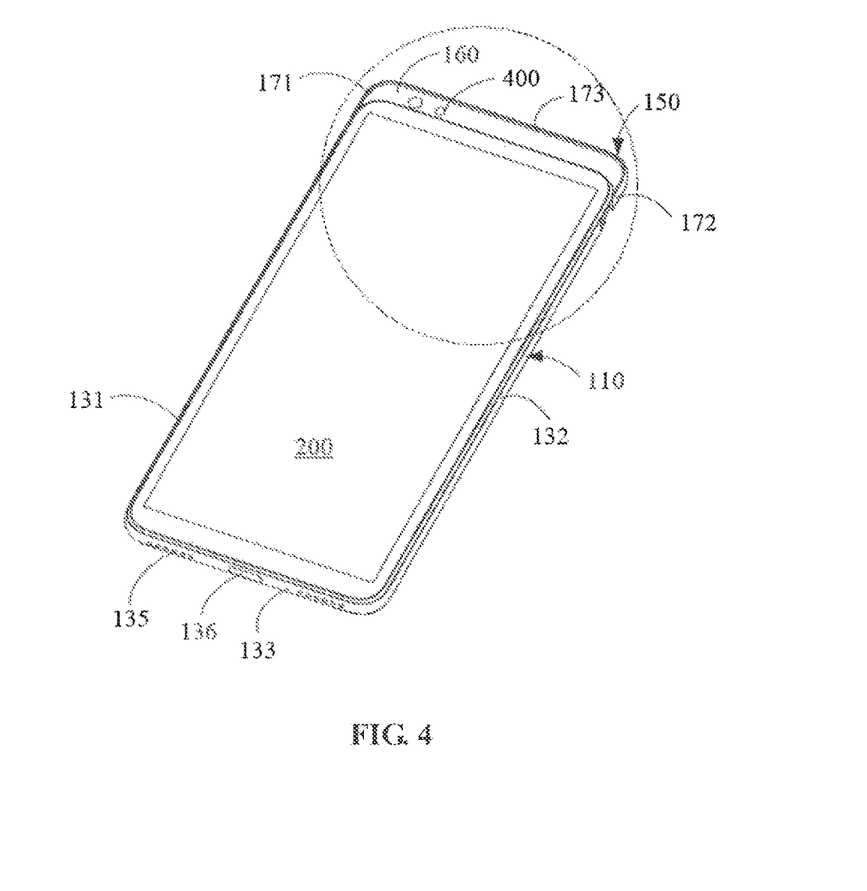
FIG. 4 illustrates a perspective diagram of a mobile terminal at an angle according to an embodiment; herein, a second shell in the mobile terminal is at a second position relative to a first shell.
Figure 5:
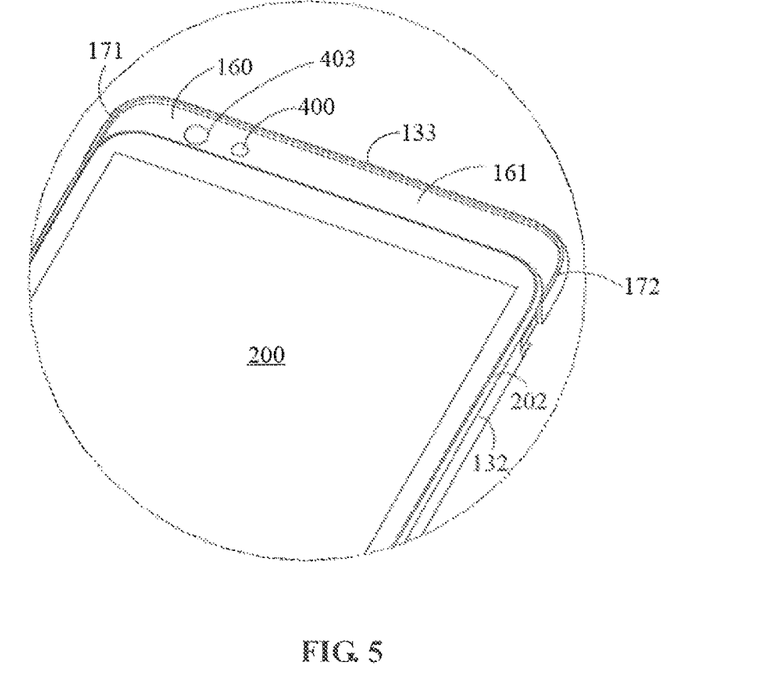
FIG. 5 illustrates an enlarged diagram of a structure in a circle illustrated in FIG. 4.

As illustrated in FIG. 1 to FIG. 5, a mobile terminal is described with a mobile phone as an example in an embodiment. The mobile terminal includes a rear housing 100, a display screen 200 and a camera 400. The rear housing 100 includes a first shell 110 and a second shell 150 arranged slidably. The second shell 150 is provided with a first position and a second position relative to/with respect to the first shell 110. Herein, the second shell 150 illustrated in FIG. 1 to FIG. 3 is at the first position relative to the first shell 110, and the second shell 150 illustrated in FIG. 4 and FIG. 5 is at the second position relative to the first shell 110. The rear housing 100 is provided with a first side surface and a second side surface opposite to the first side surface. The display screen 200 is arranged at the side where the first side surface of the rear housing 100 is located. When the second shell 150 is located at the first position relative to the first shell 110, a continuous surface is formed at the side where the second side surface of the rear housing 100 is located. The camera 400 is arranged on the second shell 150 and can be moved along with the second shell 150 relative to the first shell 110 to stop at the first position and the second position. As illustrated in FIG. 1 to FIG. 3, when the second shell 150 is at the first position, the camera 400 is hidden in the mobile terminal; that is, the camera 400 is blocked by other components of the mobile terminal and cannot be seen from the outside. As illustrated in FIG. 4 and FIG. 5, when the camera 400 is moved to the second position along with the second shell 150, the camera 400 can be exposed, that is, the camera 400 can be observed from the outside of the mobile terminal. At this moment, the camera 400 may be used to perform operations such as photographing, video call and so on.

When the camera 400 does not need to be used, the second shell 150 may be located at the first position relative to the first shell 110. When the camera 400 needs to be used, the second shell 150 may be located at the second position relative to the first shell 110. And through such an arrangement, the implementation of normal photographing and view finding functions of the camera 400 is not affected. Meanwhile, the space for providing the display screen 200 is not occupied and the screen-to-body ratio of the mobile phone may be improved.

As illustrated in FIG. 3, FIG. 4, FIG. 5, FIG. 6 and FIG. 7, the first shell 110 includes a primary backboard 120 and side perimeter edges 130. In one embodiment, the primary backboard 120 is substantially a rounded rectangle. The primary backboard 120 includes a first side surface 121, a second side surface 122 opposite to the first side surface 121, and four side edges. It is assumed that a plane parallel to an XY plane is defined at a position on a height direction of the mobile terminal (a Z-axis direction illustrated in FIG. 1), all positions on the first side surface 121 may be located at one side of the plane, and all position on the second side surface 122 may be located on the other opposite side of the plane. Herein, the display screen 200 is installed at the side where the first side surface 121 of the primary backboard 120 is located. One side of the first side surface 121 of the primary backboard 120 may be sunken/depressed/hollowed to form a holding cavity, so that the first side surface 121 of the primary backboard 120 does not appear to be one plane but a combination with multiple step-like surfaces at last. The display screen 200 is at least partially located in the holding cavity, formed by/in/on the primary backboard 120, on a thickness direction. The holding cavity formed on the primary backboard 120 may also/further be used for placing other components of the mobile terminal, such as a mainboard, a power supply, a driving piece (a motor 600 illustrated in FIG. 11) and so on. In order to place the above other components, structures such as a groove, a hole, a bump/projection, a plate and so on, may further be formed on the primary backboard 120. No matter what the specific shape of the structure on the primary backboard 120 is, the side toward/facing the display screen 200 pertains/belongs to the first side surface 121 of the primary backboard 120, and the opposite other side pertains to the second side surface 122 of the primary backboard 120. The side where the first side surface 121 of the primary backboard 120 is located may also be referred to as a front side of the primary backboard 120. The display screen 200 is arranged on the front side of the primary backboard 120. The side where the second side surface 122 of the primary backboard 120 is located may also be referred to as a rear side of the primary backboard 120.

The four side edges of the primary backboard 120 include a left side edge, a right side edge, a bottom side edge and a top side edge. The side perimeter edges 130 are arranged on three side edges of the primary backboard 120 including the left side edge, the right side edge and the bottom side edge. The side perimeter edges 130 includes a first side perimeter edge 131, a second side perimeter edge 132 opposite to the first side perimeter edge 131, and a third side perimeter edge 133 which is connected with and is located between the first side perimeter edge 131 and the second side perimeter edge 132. Herein, the first side perimeter edge 131 is arranged on the left side edge of the primary backboard 120, the second side perimeter edge 132 is arranged on the right side edge of the primary backboard 120, and the third side perimeter edge 133 is arranged on the bottom side edge of the primary backboard 120. Each side perimeter edge extends out at the side where the first side surface 121 of the primary backboard 120 is located; by virtue of the height of each side perimeter edge (the size on the Z-axis direction illustrated in FIG. 1), a holding space with a certain depth is formed at the side where the first side surface 121 of the primary backboard 120 is located by each of the side perimeter edges together with the primary backboard 120, so as to place/accommodate the display screen 200. And meanwhile, the display screen 200 is fixedly connected with the first side perimeter edge 131, the second side perimeter edge 132 and the third side perimeter edge 133.

As illustrated in FIG. 5, buffer edges 202 are provided/disposed/arranged at borders of the display screen 200 fixedly connected with/to the first side perimeter edge 131, the second side perimeter edge 132 and the third side perimeter edge 133; and the hardness of each buffer edge 202 is smaller than that of a cover plate of the display screen 200. In general, the cover plate of the display screen 200 is made of a glass or a hard plastic, so as to protect an internal structure of the display screen 200 from being impacted/struck to damage. The hardness of each of the buffer edges 202 may be smaller/less than that of the glass or that of the hard plastic. Each of the buffer edges 202 may be a plastic strip. The buffer edges 202 may be fixed between the side perimeter edges 130 and the display screen 200 by virtue of a glue. By means of the buffer edges 202, the connections between the display screen 200 and the first side perimeter edge 131, the second side perimeter edge 132 and the third side perimeter edge 133 have a certain plastic deformation space. When the display screen 200 is impacted, the stability of the connection between the display screen 200 and each of the first side perimeter edge 131, the second side perimeter edge 132 and the third side perimeter edge 133 cannot be affected, and the physical damage such as a crack due to the impact is avoided.

The outer surface of each of the side perimeter edges 130 may be a plane and may also be an arc surface. For example, the third side perimeter edge 133 is protruded outward on a direction far away from the second shell 150 to form an arc/camber. The first side perimeter edge 131 and the second side perimeter edge 132 may also be protruded outward on a direction far away from each other to form an arc/camber. As illustrated in FIG. 4, a loudspeaker hole 135 and a connection port 136 (for example, a port for connecting an external power supply) are formed on the third side perimeter edge 133. A button may further be arranged on the first side perimeter edge 131; and the button may be used for adjusting a volume and other functions.

The edge where the top end of the display screen 200 is located is beyond the first side perimeter edge 131 and the second side perimeter edge 132 as well as the top side edge of the primary backboard 120. The second shell 150 is correspondingly and slidably mounted on a portion on the top end of the display screen 200 which is beyond the first shell 110.

The second shell 150 includes a secondary backboard 160 and outer perimeter edges 170. In one embodiment, the shape of the secondary backboard 160 is similar to that of the primary backboard 120, but the area of the secondary backboard 160 is smaller than that of the primary backboard 120. The secondary backboard 160 also includes a first side surface 161, and a second side surface 162 opposite to the first side surface 161, and four side edges. The orientation of the first side surface 161 of the secondary backboard 160 is the same as that of the first side surface 121 of the primary backboard 120, and the orientation of the second side surface 162 of the secondary backboard 160 is the same as that of the second side surface 122 of the primary backboard 120. The side where the first side surface 161 of the secondary backboard 160 is located is also the front side of the mobile terminal, and the side where the second side surface 162 of the secondary backboard 160 is located is also the rear side of the mobile terminal. After the second shell 150 and the first shell 110 are installed completely, the second side surface 162 of the secondary backboard 160 is flush/level with the second side surface 122 of the primary backboard 120. At the first position, a continuous surface is formed by the second side surface 162 of the secondary backboard 160 and the second side surface 122 of the primary backboard 120. In the case of high processing accuracy, a fit clearance between the second side surface 162 of the secondary backboard 160 and the second side surface 122 of the primary backboard 120 even cannot be distinguished by naked eyes.

The four side edges of the secondary backboard 160 include a left side edge, a right side edge, a bottom side edge and a top side edge. Herein, a slip/sliding connection is formed between the bottom side edge of the secondary backboard 160 and the top side edge of the primary backboard 120. In some embodiments, the bottom side edge of the secondary backboard 160 extends toward the primary backboard 120 to form a sliding tongue 163, and the sliding tongue 163 is slidably arranged on the primary backboard 120. A certain layer difference is provided between the sliding tongue 163 and the second side surface 162 of the secondary backboard 160, so that an overlap joint is formed between the sliding tongue 163 and the side where the first side surface 121 of the primary backboard 120 is located, and the second side surface 162 of the secondary backboard 160 still can be flush with the second side surface 122 of the primary backboard 120.

The outer perimeter edges 170 are arranged on three side edges of the secondary backboard 160 including the left side edge, the right side edge and the top side edge. The outer perimeter edges 170 includes a first outer perimeter edge 171, a second outer perimeter edge 172 opposite to the first outer perimeter edge 171, and a third outer perimeter edge 173 which is connected with and is located between the first outer perimeter edge 171 and the second outer perimeter edge 172. Herein, the first outer perimeter edge 171 is arranged on the left side edge of the secondary backboard 160, the second outer perimeter edge 172 is arranged on the right side edge of the secondary backboard 160, and the third outer perimeter edge 173 is arranged on the top side edge of the secondary backboard 160.

Each of the outer perimeter edges 170 extends out from the side where the first side surface 161 of the secondary backboard 160 is located, so that a holding space with a certain depth is formed by each of the side perimeter edges together with the side where the first side surface 161 of the secondary backboard 160 is located. At the first position, the holding space may be used for at least partially holding the display screen 200. In other words, the height of the each of the outer perimeter edges 170 (the extension size on the Z-axis direction) is greater than that of the secondary backboard 160. The outer surface of each of the outer perimeter edges 170 may be a plane and may also be an arc surface. For example, the first outer perimeter edge 171 and the second outer perimeter edge 172 may be protruded outward on a direction far away from each other to form an arc/camber; and the third outer perimeter edge 173 is protruded outward on a direction far away from the first shell 110 to form an arc/camber.

As illustrated in FIG. 1 and FIG. 2, when the second shell 150 is at the first position, the first side perimeter edge 131 is connected with the first outer perimeter edge 171, the second side perimeter edge 132 is connected with the second outer perimeter edge 172, and the portion, beyond the first shell 110, of the display screen 200 is in a tight fit with the first outer perimeter edge 171, the second outer perimeter edge 172, and the third outer perimeter edge 173 of the second shell 150. In appearance, the display screen 200 is also connected with the first outer perimeter edge 171, the second outer perimeter edge 172, and the third outer perimeter edge 173. In the case of high processing accuracy, a fit clearance between the display screen 200 and each of the first outer perimeter edge 171, the second outer perimeter edge 172, and the third outer perimeter edge 173 even cannot be distinguished by the naked eyes. At the first position, it may be considered that each of the side perimeter edges of the first shell 110 and each of the outer perimeter edges of the second shell 150 jointly support the display screen 200.

When the camera 400 needs to be used, the second shell 150 is slid relative to the first shell 110. As illustrated in FIG. 4 and FIG. 5, at the second position, the first side perimeter edge 131 is separated from the first outer perimeter edge 171, and the second side perimeter edge 132 is separated from the second outer perimeter edge 172.

Figure 7:
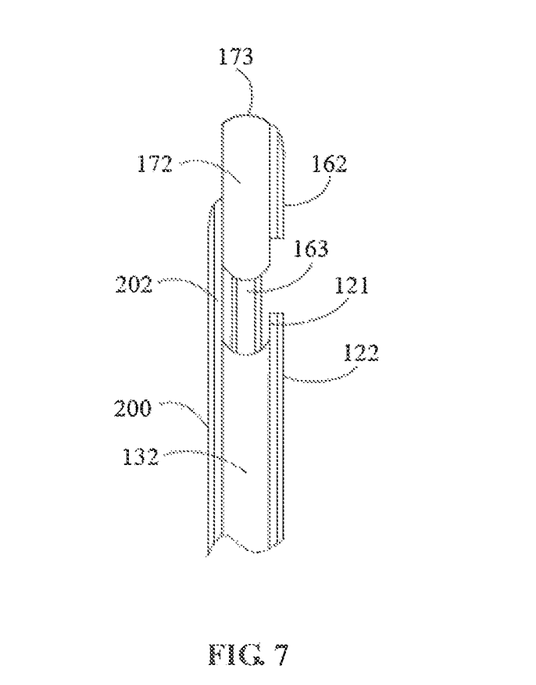
FIG. 7 illustrates an enlarged diagram of a side structure of the mobile terminal illustrated in FIG. 4.

As illustrated in FIG. 7, the abutting edge of the first side perimeter edge 131 and the first outer perimeter edge 171 may be an arc line, and thus a gap formed when the first side perimeter edge 131 and the first outer perimeter edge 171 are connected may be of an arc line type. Similarly, the abutting edge of the second side perimeter edge 132 and the second outer perimeter edge 172 may be an arc line, and thus a gap formed when the second side perimeter edge 132 and the second outer perimeter edge 172 are connected may be of an arc line type.

Figure 8:
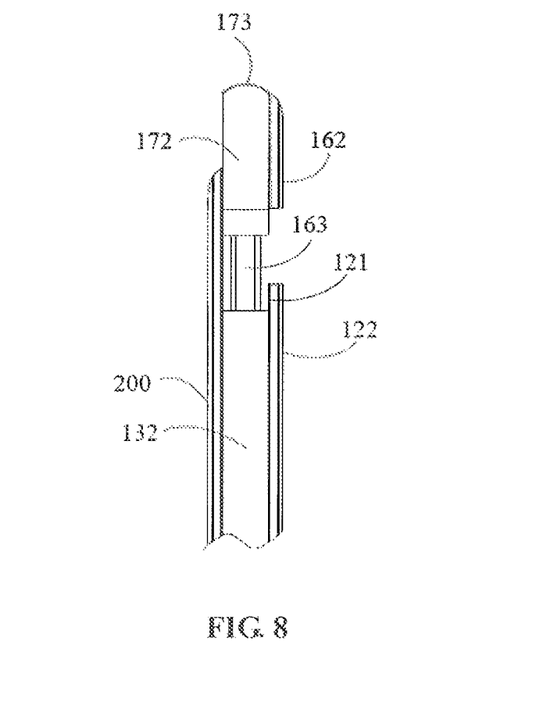
FIG. 8 illustrates an enlarged diagram of a side structure of a mobile terminal according to a different embodiment.

In other some embodiments, as illustrated in FIG. 8, the edge where the first side perimeter edge 131 is in an abutment joint with the first outer perimeter edge 171 may be a straight line, and thus the gap formed by connecting the first side perimeter edge 131 with the first outer perimeter edge 171 may be of a straight line type. Likewise, the edge where the second side perimeter edge 132 is in an abutment joint with the second outer perimeter edge 172 may be a straight line, and thus the gap formed by connecting the second side perimeter edge 132 with the second outer perimeter edge 172 may be of a straight line type.

Figure 9:
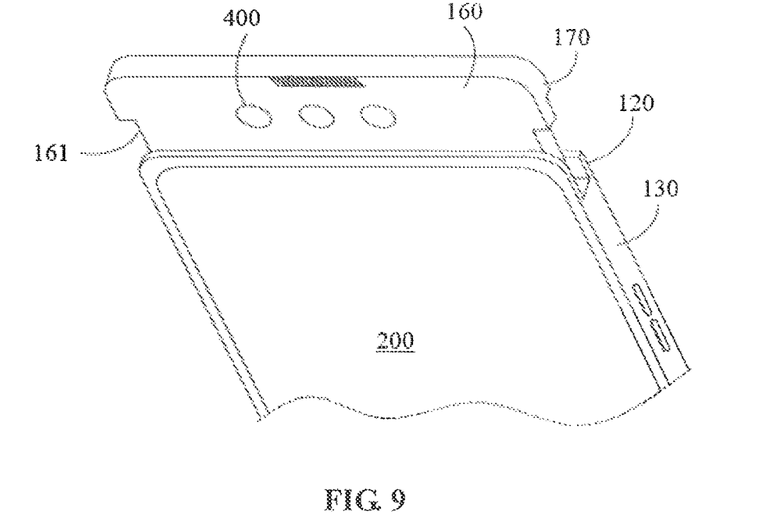
FIG. 9 illustrates a perspective diagram of a partial structure of a mobile terminal according to another embodiment.
Figure 10:
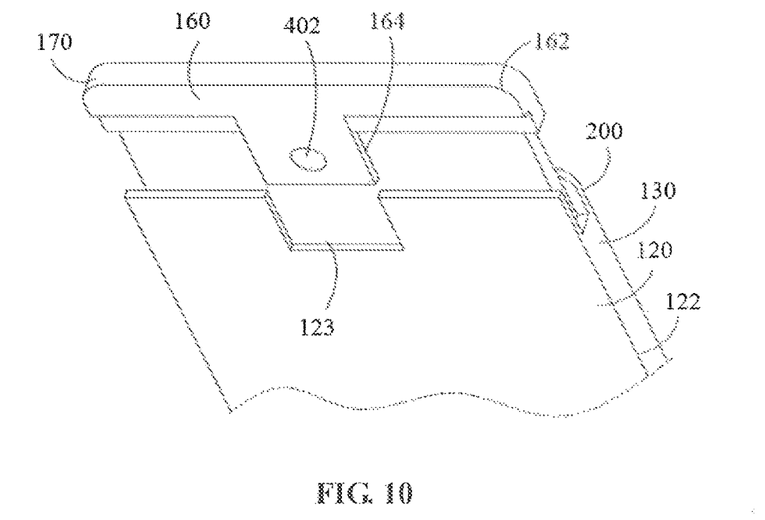
FIG. 10 illustrates a perspective diagram of the mobile terminal illustrated in FIG. 9 at another angle.

As illustrated in FIG. 9 and FIG. 10, in one embodiment, the second side surface 122 of the primary backboard 120 is provided with a notch 123 at the top side edge. The second side surface 162 of the secondary backboard 160 is provided with a bump 164 at the bottom side edge; and the bump 164 is cooperated with the notch 123.

In one embodiment, the mobile terminal further includes another camera 402. The orientation of a light incident surface of the another camera 402 is opposite to that of the display screen 200. The another camera 402 may be exposed out of the side where the second side surface 162 of the secondary backboard 160 is located. No matter whether the secondary backboard 160 is located at the first position or the second position relative to the primary backboard 120, the another camera 402 is exposed and may be used as a rear camera.

Figure 6:
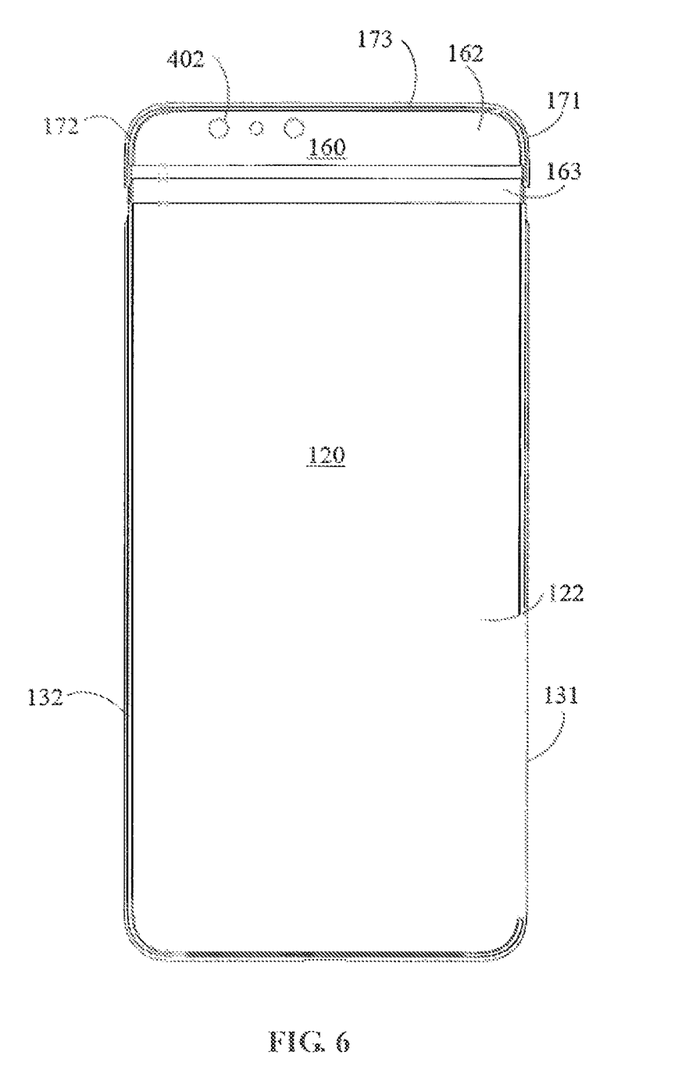
FIG. 6 illustrates a rear diagram of the mobile terminal illustrated in FIG. 4.

As illustrated in FIG. 3 and FIG. 6, in one embodiment, the camera 400 arranged on the first side surface 161 of the secondary backboard 160 and the another camera 402 arranged on the second side surface 162 of the secondary backboard 160 are staggered/interlaced to each other i.e., mutually staggered, on the secondary backboard 160. Since the cameras are provided with a certain height respectively, the camera 400 and the another camera 402 are in a staggered/interlaced manner. Therefore, the overlap on the height may be avoided, the size of the secondary backboard 160 on the Z-axis direction is prevented from being overlarge, and the overall height of the mobile terminal can be reduced.

As illustrated in FIG. 10, in one embodiment, the another camera 402 is arranged on the bump 164 of the second side surface 162 of the secondary backboard 160, and an orientation of a light incident surface of the another camera 402 is opposite to that of the display screen 200. Since the another camera 402 is separated from the camera 400, the overlap on the height may be avoided, the size of the secondary backboard 160 on the Z-axis direction is prevented from being overlarge, and the overall height of the mobile terminal can be reduced.

As illustrated in FIG. 5, the mobile terminal further includes a face recognition component 403. The face recognition component 403 includes elements such as an infrared camera, a floodlight induction element, a distance sensor, a dot matrix projector and the like arranged on the secondary backboard 160, and faces can be identified by the cooperation of these components. The face recognition component 403 and the camera 400 both are arranged on the side where the first side surface 161 of the secondary backboard 160 is located. When the secondary backboard 160 is located at the first position, the face recognition component 403 is blocked. When the secondary backboard 160 is located at the second position, the face recognition component 403 is exposed out of the mobile terminal.

The slip/sliding connection between the secondary backboard 160 and the primary backboard 120 is realized by a corresponding transmission mechanism. By virtue of the transmission mechanism, the secondary backboard 160 and the primary backboard 120 are more automatically switched back and forth between the first position and the second position.

Figure 11:
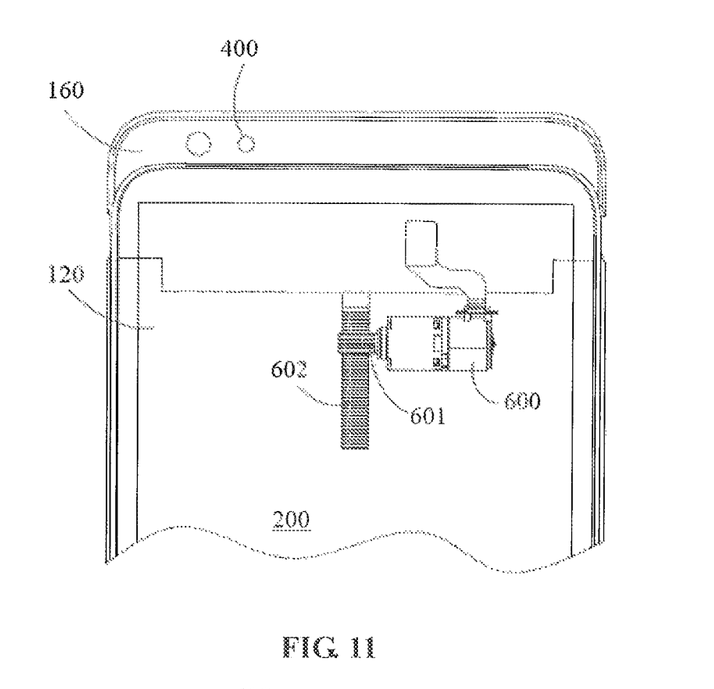
FIG. 11 illustrates a transmission mechanism of a mobile terminal according to an embodiment.
Figure 12:
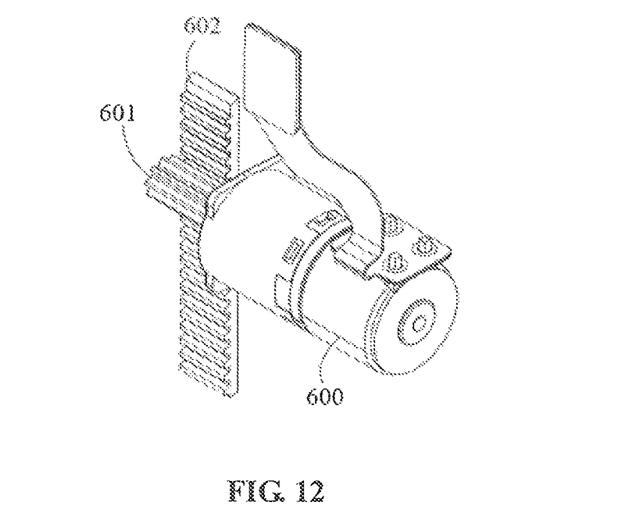
FIG. 12 illustrates an enlarged diagram of the transmission mechanism of the mobile terminal illustrated in FIG. 11.

As illustrated in FIG. 11 and FIG. 12, in one embodiment, the mobile terminal includes a motor 600. A gear 601 is arranged on an output shaft of the motor 600. A rack 602 is arranged on the secondary backboard 160, and the rack 602 is cooperated with the gear 601 so that the secondary backboard 160 is switched between the first position and the second position relative to the primary backboard 120 by virtue of the motor 600. The motor 600 can communicate with a mainboard of the mobile terminal and implement the rotation at different directions by receiving a control signal sent from the mainboard. Therefore, the secondary backboard 160 may be driven to switch between the first position and the second position. The motor 600 may be fixed on the primary backboard 120. A sliding rail and a sliding groove cooperated to each other may further be provided between the primary backboard 120 and the secondary backboard 160, so that the movement of the secondary backboard 160 relative to the primary backboard 120 is smoother.

Figure 13:
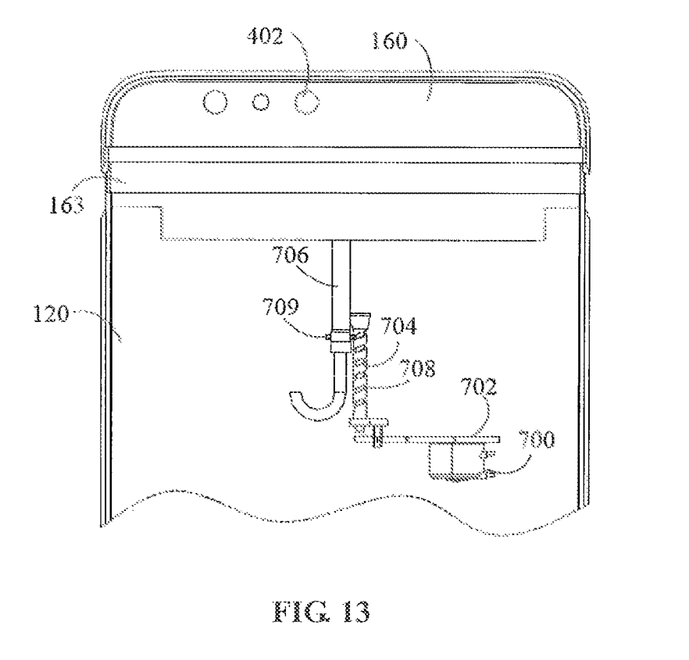
FIG. 13 illustrates a transmission mechanism of a mobile terminal according to another embodiment; herein, a second shell is at a second position relative to a first shell.
Figure 14:
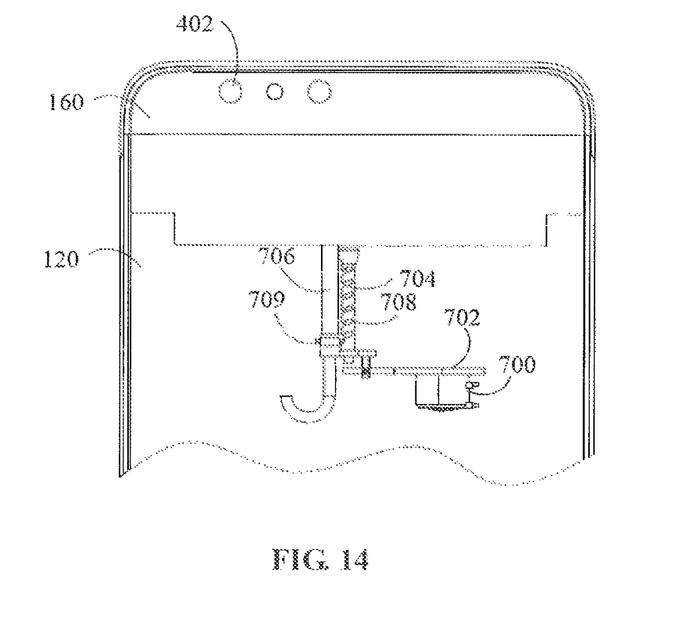
FIG. 14 illustrates a transmission mechanism of a mobile terminal according to another embodiment; herein, a second shell is at a first position relative to a first shell.
Figure 15:
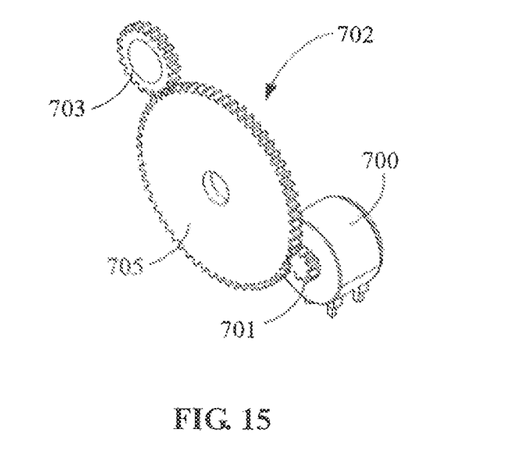
FIG. 15 illustrates an enlarged diagram of a partial transmission mechanism of the mobile terminal illustrated in FIG. 13 and FIG. 14.

As illustrated in FIG. 13, FIG. 14 and FIG. 15, in another embodiment, the mobile terminal includes a motor 700, a gearbox 702, a screw rod 704 and a sliding rod 706. An output shaft of the gearbox 702 is parallel to a movement direction of the secondary backboard 160. The gearbox 702 is connected between the motor 700 and the screw rod 704 so that the motor 700 drives the screw rod 704 to rotate. A spiral groove 708 is formed on the screw rod 704, and the sliding rod 706 is connected with the secondary backboard 160 and is provided with a clamping ring 709 which is cooperated with the spiral groove 708. The rotation of the screw rod 704 drives the clamping ring 709 on the sliding rod 706 to move in the spiral groove 708, so that the secondary backboard 160 is switched between the first position and the second position relative to the primary backboard 120. The clamping ring 709 is rotatably arranged on the sliding rod 706, so that the friction force generated by the sliding rod 706 in the process of moving relative to the screw rod 704 can be reduced, and the movement of the sliding rod 706 relative to the screw rod 704 is more labor-saving and energy-saving. The motor 700 can communicate with the mainboard of the mobile terminal and implement the rotation at different directions by receiving a control signal sent from the mainboard, and thus the secondary backboard 160 may be driven to switch between the first position and the second position. The sliding rod 706 may be hollow, and an internal space may be used as a routing channel, so that the cameras 400 and 402 on the secondary backboard 160 can communicate with the mainboard of the mobile terminal. The gearbox 702 includes a first gear 703 and a second gear 705 meshed/engaged with each other. The first gear 703 may be cooperated with the screw rod 704, thus driving the screw rod 704 to rotate. The second gear 705 may be meshed with an output gear 701 on the output shaft of the motor 700. The number of gears in/of the gearbox 702 and the size ratio of each gear may be provided reasonably according to the size of the mobile terminal and the space configuration of other components.

The display screen 200 may be an organic light-emitting diode (OLED) display screen or a liquid crystal display (LCD) screen. The display screen 200 may be provided with a touch component so that the display screen 200 has the functions of a touchable operation.

The materials of the first shell 110 and the second shell 150 may be the same and may also be different. In some embodiments, the first shell 110 may be made of a metal material, a glass material, or a ceramic material.

When the first shell 110 is at the first position relative to the second shell 150, the ratio of a displaying area of the display screen 200 to an area of an outline of the rear housing 100 is greater than or equal to 83%.

Each technical characteristic of the above embodiments may be combined freely. To describe briefly, all possible combinations for the each technical characteristic of the above embodiments are not described. However, as long as there is no conflict among the combinations of the technical characteristics, all should be considered as a scope recorded by the specification.

The above embodiments only describe several implementation manners of the present disclosure, and the description is specific and detail but cannot be understood as the limit to the scope of the present disclosure. It is to be noted that, those skilled in the art may further make several variations and improvements without departing from the concept of the present disclosure and all belong to the scope of protection of the present disclosure. Accordingly, the scope of protection of the present disclosure should be subject to the appended claims.

The invention claimed is:

1. A mobile phone, comprising:
a rear housing, which comprises a first shell and a second shell; wherein the first shell comprises a primary backboard and side perimeter edges; the primary backboard comprises a first side surface, a second side surface opposite to the first side surface, and four side edges; the side perimeter edges are arranged on three side edges of the primary backboard and comprise a first side perimeter edge, a second side perimeter edge opposite to the first side perimeter edge, and a third side perimeter edge connected between the first side perimeter edge and the second side perimeter edge; wherein the second shell comprises a secondary backboard and outer perimeter edges; the secondary backboard comprises a first side surface, a second side surface opposite to the first side surface, and four side edges; the outer perimeter edges are arranged on three side edges of the secondary backboard and comprises a first outer perimeter edge, a second outer perimeter edge opposite to the first outer perimeter edge, and a third outer perimeter edge connected between the first outer perimeter edge and the second outer perimeter edge; the side edge of the secondary backboard without the outer peripheral edge is slidably connected with the side edge of the primary backboard without the side peripheral edge; the secondary backboard is provided with a first position and a second position relative to the primary backboard; at the first position, the first side perimeter edge is connected with the first outer perimeter edge, and the second side perimeter edge is connected with the second outer perimeter edge; at the second position, the first side perimeter edge is separated from the first outer perimeter edge, and the second side perimeter edge is separated from the second outer perimeter edge;
a display screen, located at the side where the first side surface of the primary backboard is located, and fixedly connected with the first side perimeter edge, the second side perimeter edge and the third side perimeter edge; and
a camera, arranged on the first side surface of the secondary backboard, wherein at the first position, the camera is blocked; and at the second position, the camera is exposed and an orientation of a light incident surface of the camera is identical to an orientation of the display screen;
wherein a height of each of the outer perimeter edges is greater than that of the secondary backboard.

2. The mobile phone of claim 1, wherein buffer edges are provided at borders of the display screen fixedly connected with the first side perimeter edge, the second side perimeter edge and the third side perimeter edge; and a hardness of each of the buffer edges is less than that of a cover plate of the display screen.

3. The mobile phone of claim 1, further comprising a second camera, wherein the second camera is arranged on the second side surface of the secondary backboard; and an orientation of a light incident surface of the second camera is opposite to an orientation of the display screen.

4. The mobile phone of claim 3, wherein the second camera and the camera are mutually staggered on the secondary backboard.

5. The mobile phone of claim 1, wherein the second side surface of the primary backboard is level with the second side surface of the secondary backboard.

6. The mobile phone of claim 1, wherein the second side surface of the primary backboard is provided with a notch at the side edge of the primary backboard without the side peripheral edge; the second side surface of the secondary backboard is provided with a bump at the side edge of the secondary backboard without the outer peripheral edge; and the bump is cooperated with the notch.

7. The mobile phone of claim 6, further comprising a second camera, the second camera is arranged on the bump of the second side surface, and an orientation of a light incident surface of the second camera is opposite to that of the display screen.

8. The mobile phone of claim 1, wherein a gap formed by connecting the first side perimeter edge with the first outer perimeter edge is of a linear shape, an arc shape or a broken line shape.

9. The mobile phone of claim 1, wherein a gap formed by connecting the second side perimeter edge with the second outer perimeter edge is of a linear shape, an arc shape or a broken line shape.

10. The mobile phone of claim 1, comprising a motor, wherein the motor is fixed on the primary backboard; an output shaft of the motor is provided with a gear; the secondary backboard is provided with a rack; and the rack is cooperated with the gear so that the secondary backboard is switched between the first position and the second position relative to the primary backboard by virtue of the motor.

11. The mobile phone of claim 1, comprising a motor, a gearbox, a screw rod and a sliding rod; wherein an output shaft of the gearbox is parallel to a movement direction of the secondary backboard; the gearbox comprises at least two engaged gears; the gearbox is connected between the motor and the screw rod so that the motor drives the screw rod to rotate; the screw rod is provided with a spiral groove; the sliding rod is connected with the secondary backboard and is provided with a clamping ring which is cooperated with the spiral groove; and a rotation of the screw rod drives the sliding rod to move so that the secondary backboard is switched between the first position and the second position relative to the primary backboard.

12. The mobile phone of claim 11, wherein the clamping ring is rotatably arranged on the sliding rod.

13. The mobile phone of claim 1, wherein the side edge of the secondary backboard without the outer peripheral edge extends toward the primary backboard to form a sliding tongue, and the sliding tongue is slidably arranged on the primary backboard.

14. The mobile phone of claim 1, further comprising a face recognition component arranged on the secondary backboard; at the first position, the face recognition component is blocked; and at the second position, the face recognition component is exposed.

15. The mobile phone of claim 1, wherein the first shell is made of a metal material, a glass material, or a ceramic material.

16. The mobile phone of claim 1, wherein the second shell is made of a metal material, a glass material, or a ceramic material.

17. The mobile phone of claim 1, wherein the display screen is an organic light emitting diode (OLED) display screen or a liquid crystal display (LCD) screen.

18. The mobile phone of claim 1, wherein when the first shell is at the first position relative to the second shell, a ratio of a displaying area of the display screen to an area of an outline of the rear housing is greater than or equal to 83%.

19. A mobile phone, comprising:
a rear housing, which comprises a first shell and a second shell arranged slidably, the second shell is provided with a first position and a second position relative to the first shell; the rear housing is provided with a first side surface and a second side surface opposite to the first side surface; when the second shell is located at the first position relative to the first shell, a continuous surface is formed at a side where the second side surface of the rear housing is located;
a display screen, which is arranged at a side where the first side surface of the rear housing is located; and
a camera, which is arranged on the second shell and is moved along with the second shell relative to the first shell; when the camera is moved to the first position along with the second shell, the camera is hidden in the mobile terminal; when the camera is moved to the second position along with the second shell, the camera is exposed outside the mobile terminal, and an orientation of a light incident surface of the camera is identical to an orientation of the display screen;
further comprising a second camera, wherein the second camera is arranged on the second shell; and an orientation of a light incident surface of the second camera is opposite to an orientation of the display screen.

* * * * *